United States Patent
Deckers et al.

(10) Patent No.: US 11,476,217 B2
(45) Date of Patent: Oct. 18, 2022

(54) METHOD OF MANUFACTURING AN AUGMENTED LED ARRAY ASSEMBLY

(71) Applicant: Lumileds LLC, San Jose, CA (US)

(72) Inventors: Michael Deckers, Aachen (DE); Tze Yang Hin, San Jose, CA (US); Ronald Bonne, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/814,024

(22) Filed: Mar. 10, 2020

(65) Prior Publication Data

US 2021/0288008 A1 Sep. 16, 2021

(51) Int. Cl.

| | |
|---|---|
| *G02F 1/1345* | (2006.01) |
| *H01L 23/52* | (2006.01) |
| *H01L 21/50* | (2006.01) |
| *H01L 27/12* | (2006.01) |
| *G02F 1/1362* | (2006.01) |
| *G02F 1/1368* | (2006.01) |
| *H01L 23/00* | (2006.01) |
| *H01L 23/498* | (2006.01) |
| *H01L 25/075* | (2006.01) |

(Continued)

(52) U.S. Cl.
CPC ........ *H01L 24/09* (2013.01); *H01L 23/49816* (2013.01); *H01L 25/0753* (2013.01); *H01L 27/0248* (2013.01); *H01L 27/156* (2013.01); *H01L 2924/14* (2013.01)

(58) Field of Classification Search
CPC ....... H01L 33/505; H01L 33/58; H01L 33/60; H01L 33/62; H01L 33/642
See application file for complete search history.

(56) References Cited

U.S. PATENT DOCUMENTS

| 5,073,814 A | 12/1991 | Cole, Jr. et al. |
| 6,730,391 B1 | 5/2004 | Saijo et al. |
| (Continued) | | |

FOREIGN PATENT DOCUMENTS

| CN | 102315208 A | 1/2012 |
| EP | 3113236 | 1/2017 |
| (Continued) | | |

OTHER PUBLICATIONS

Extended European Search Report dated Sep. 2, 2020 for European Patent Application No. 20158481.0.

(Continued)

*Primary Examiner* — Brian Turner
(74) *Attorney, Agent, or Firm* — Volpe Koenig

(57) ABSTRACT

A method of manufacturing an augmented LED array assembly is described which comprises providing an LED array assembly configured for inclusion in an LED lighting circuit, the LED array assembly comprising a micro-LED array mounted onto a driver integrated circuit, the driver integrated circuit comprising contact pads configured for electrical connections to a circuit board assembly; providing an essentially planar carrier comprising a plurality of contact bridges, each contact bridge extending between a first contact pad and a second contact pad; and mounting the contact bridge carrier to the LED array assembly by forming solder bonds between the first contact pads of the contact bridge carrier and the contact pads of the driver integrated circuit.

16 Claims, 3 Drawing Sheets

(51) Int. Cl.
*H01L 27/02* (2006.01)
*H01L 27/15* (2006.01)

(56) References Cited

U.S. PATENT DOCUMENTS

| | | | |
|---|---|---|---|
| 6,936,855 B1* | 8/2005 | Harrah | F21K 9/00 |
| | | | 257/59 |
| 7,550,319 B2 | 6/2009 | Wang et al. | |
| 8,513,790 B2 | 8/2013 | Chen et al. | |
| 8,536,714 B2 | 9/2013 | Sakaguchi | |
| 8,773,006 B2 | 7/2014 | Kim et al. | |
| 8,912,650 B2 | 12/2014 | Choi et al. | |
| 9,018,655 B2 | 4/2015 | Tu et al. | |
| 9,615,453 B2 | 4/2017 | Yang | |
| 9,653,397 B2 | 5/2017 | Kwon et al. | |
| 9,899,465 B2 | 2/2018 | Bower et al. | |
| 10,005,384 B2 | 6/2018 | Canonne et al. | |
| 10,205,055 B2 | 2/2019 | Chu et al. | |
| 10,262,977 B2 | 4/2019 | Henry et al. | |
| 10,347,509 B1 | 7/2019 | Shen | |
| 10,420,204 B2 | 9/2019 | Lin et al. | |
| 10,529,690 B2 | 1/2020 | Shih et al. | |
| 10,665,578 B2 | 5/2020 | Huitema et al. | |
| 10,683,986 B2 | 6/2020 | Lefaudeux et al. | |
| 2003/0020156 A1 | 1/2003 | Farquhar et al. | |
| 2003/0136577 A1 | 7/2003 | Abe | |
| 2005/0263867 A1 | 12/2005 | Kambe et al. | |
| 2005/0269287 A1 | 12/2005 | Tsujimura et al. | |
| 2006/0141851 A1 | 6/2006 | Matsui et al. | |
| 2007/0080458 A1 | 4/2007 | Ogawa et al. | |
| 2009/0046432 A1 | 2/2009 | Hsu | |
| 2009/0207630 A1 | 8/2009 | Satoh et al. | |
| 2010/0039817 A1* | 2/2010 | Wen | F21V 29/763 |
| | | | 362/253 |
| 2010/0155746 A1 | 6/2010 | Ibbetson et al. | |
| 2011/0030209 A1 | 2/2011 | Chang et al. | |
| 2011/0121347 A1 | 5/2011 | Liu et al. | |
| 2012/0175643 A1 | 7/2012 | West | |
| 2012/0188734 A1 | 7/2012 | Mikado et al. | |
| 2012/0273960 A1 | 11/2012 | Park et al. | |
| 2013/0075924 A1 | 3/2013 | Lin et al. | |
| 2013/0193463 A1 | 8/2013 | Kong et al. | |
| 2013/0221452 A1 | 8/2013 | Strothmann et al. | |
| 2013/0328067 A1 | 12/2013 | Tsou et al. | |
| 2014/0021493 A1 | 1/2014 | Andrews et al. | |
| 2014/0061930 A1 | 3/2014 | Holmes et al. | |
| 2014/0124777 A1 | 5/2014 | Nakatani et al. | |
| 2014/0182896 A1 | 7/2014 | Lee et al. | |
| 2014/0251658 A1 | 9/2014 | Lin et al. | |
| 2014/0268780 A1 | 9/2014 | Wang et al. | |
| 2014/0306845 A1* | 10/2014 | Shiu | H01Q 1/38 |
| | | | 343/700 MS |
| 2015/0054001 A1 | 2/2015 | Oganesian et al. | |
| 2015/0054406 A1 | 2/2015 | Gershowitz et al. | |
| 2015/0084206 A1 | 3/2015 | Lin | |
| 2015/0200185 A1 | 7/2015 | Yu et al. | |
| 2015/0303219 A1* | 10/2015 | Tada | G02F 1/136286 |
| | | | 257/386 |
| 2015/0319868 A1 | 11/2015 | Wei et al. | |
| 2015/0371585 A1 | 12/2015 | Bower et al. | |
| 2016/0050771 A1 | 2/2016 | Yu et al. | |
| 2016/0172402 A1 | 6/2016 | Katkar | |
| 2016/0316565 A1 | 10/2016 | Chen et al. | |
| 2016/0324004 A1 | 11/2016 | Schwarz et al. | |
| 2017/0009978 A1 | 1/2017 | Hong et al. | |
| 2017/0025593 A1 | 1/2017 | Bower et al. | |
| 2017/0033062 A1 | 2/2017 | Liu et al. | |
| 2017/0040306 A1 | 2/2017 | Kim et al. | |
| 2017/0062383 A1 | 3/2017 | Yee et al. | |
| 2017/0140202 A1 | 5/2017 | Huang et al. | |
| 2017/0358562 A1 | 12/2017 | Banna et al. | |
| 2018/0166373 A1 | 6/2018 | Lin et al. | |
| 2018/0175262 A1 | 6/2018 | Jansen et al. | |
| 2018/0197471 A1 | 7/2018 | Rotzoll et al. | |
| 2018/0226386 A1* | 8/2018 | Cok | H01L 33/0093 |
| 2018/0269188 A1 | 9/2018 | Yu et al. | |
| 2018/0269191 A1 | 9/2018 | England et al. | |
| 2018/0337135 A1 | 11/2018 | Yoshihiro et al. | |
| 2018/0337142 A1 | 11/2018 | Cheng et al. | |
| 2018/0358317 A1 | 12/2018 | Albers et al. | |
| 2019/0006283 A1 | 1/2019 | Wang et al. | |
| 2019/0056067 A1 | 2/2019 | Price et al. | |
| 2019/0066571 A1 | 2/2019 | Goward | |
| 2019/0075656 A1 | 3/2019 | Kim et al. | |
| 2019/0088603 A1 | 3/2019 | Marimuthu et al. | |
| 2019/0096864 A1* | 3/2019 | Huitema | H01L 24/82 |
| 2019/0181315 A1 | 6/2019 | Liao et al. | |
| 2019/0206833 A1 | 7/2019 | Meyer et al. | |
| 2019/0305205 A1 | 10/2019 | Feichtinger | |
| 2019/0319020 A1 | 10/2019 | Pan | |
| 2019/0333444 A1 | 10/2019 | He et al. | |
| 2019/0360673 A1* | 11/2019 | Seo | H01L 33/483 |
| 2019/0385513 A1 | 12/2019 | Iguchi et al. | |
| 2020/0105638 A1 | 4/2020 | Chiang et al. | |
| 2020/0119235 A1 | 4/2020 | Ahmed et al. | |
| 2020/0176346 A1 | 6/2020 | Wu et al. | |
| 2020/0251626 A1 | 8/2020 | Lee et al. | |
| 2021/0028766 A1 | 1/2021 | Hurwitz et al. | |
| 2021/0074645 A1 | 3/2021 | Tsai et al. | |
| 2021/0125971 A1 | 4/2021 | Chu et al. | |

FOREIGN PATENT DOCUMENTS

| | | |
|---|---|---|
| EP | 3582593 A1 | 12/2019 |
| JP | 2008-283133 A | 11/2008 |
| JP | 2009-186734 A | 8/2009 |
| JP | 2011-113989 A | 6/2011 |
| KR | 10-2013-0036650 A | 4/2013 |
| TW | 200830975 A | 7/2008 |
| TW | 200942105 A | 10/2009 |
| WO | 2018/116814 A1 | 6/2018 |
| WO | 2018/172152 A1 | 9/2018 |
| WO | 2019/013469 | 1/2019 |
| WO | 2019/168763 A1 | 9/2019 |

OTHER PUBLICATIONS

Extended European Search Report dated Jul. 7, 2020 for European Patent Application No. 20157985.1.
Extended European Search Report dated Jul. 30, 2020 for European Patent Application No. 20158288.9.
Extended European Search Report dated Sep. 11, 2020 for European Patent Application No. 20166601.3.
Extended European Search Report dated Oct. 19, 2020 for the European Patent Application No. 20169027.8.
U.S. Appl. No. 62/954,121, filed Dec. 27, 2019.
U.S. Appl. No. 16/750,809, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,824, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/750,839, filed Jan. 23, 2020, which claims the benefit of U.S. Appl. No. 62/951,601, filed Dec. 20, 2019 and U.S. Appl. No. 62/937,629, filed Nov. 19, 2019.
U.S. Appl. No. 16/809,104, filed Mar. 4, 2020, which claims the benefit of U.S. Appl. No. 62/958,058, filed Jan. 7, 2020.
U.S. Appl. No. 16/831,378, filed Mar. 26, 2020, which claims the benefit of U.S. Appl. No. 62/826,612, filed Mar. 29, 2019.
U.S. Appl. No. 16/831,384, filed Mar. 26, 2020, which claims the benefit of U.S. Appl. No. 62/826,612, filed Mar. 29, 2019.
International Search Report and Written Opinion dated Feb. 11, 2021 for PCT International Application No. PCT/US2020/061205.
International Search Report and Written Opinion dated Feb. 17, 2021 for PCT International Application No. PCT/US2020/061206.
Annex to Form PCT/ISA/206, Communication Relating to the Results of the Partial International Search dated Mar. 4, 2021 for PCT International Application No. PCT/US2020/061201.
International Search Report and Written Opinion dated Apr. 8, 2021 for PCT International Application No. PCT/US2021/012425.

(56) References Cited

OTHER PUBLICATIONS

International Search Report and Written Opinion dated Apr. 28, 2021 for PCT International Application No. PCT/US2020/061201.
International Search Report and Written Opinion dated Jun. 29, 2021 for PCT International Application No. PCT/US2021/021702.
International Search Report and Written Opinion dated Apr. 16, 2021 for PCT International Application No. PCT/US2020/066998.

\* cited by examiner

METHOD OF MANUFACTURING AN AUGMENTED LED ARRAY ASSEMBLY

FIELD

The disclosure describes a method of manufacturing an augmented LED array assembly

BACKGROUND

High-lumen LED arrays are used in lighting applications such as automotive front lighting. For example, an adaptive drive beam system can be realized using an LED array. Such an LED array may have a low pixel count, for example 10-80 single-die LEDs arranged in an array formation. For an LED array with high pixel count for greater resolution, it may be preferred to implement a fully integrated micro-LED device with several thousand LEDs or pixels.

Such a micro-LED device is generally provided in an assembly comprising a monolithic micro-LED array on top of a driver IC such as a CMOS integrated circuit, which controls the individual pixels of the LED array. Such a micro-LED assembly or "LED array assembly" must be incorporated in the system under consideration of the required electrical and thermal interfaces. Usually, the micro-LED assembly is connected to other circuitry on a printed circuit board (PCB) which provides the electrical connections to control circuitry, and a heat spreader is provided to dissipate heat from the LED array during operation. A disadvantage of such a prior art LED array assembly is that it must first be attached to the heatsink, and only then can it be connected to the PCB. The electrical connections to the PCB are usually made using wire bonds. However, such assembly steps are expensive, and it can be difficult to accurately form a large number of wire bonds in the confined space available.

Therefore, there is a need to provide an improved way of incorporating an LED array assembly into a lighting circuit.

SUMMARY

One or more embodiments provide a method of manufacturing an augmented LED array assembly, a method of manufacturing an LED lighting circuit, an augmented LED array assembly and a LED lighting circuit.

According to one or more embodiments of the disclosure, a method of manufacturing an augmented LED array assembly comprises providing an LED array assembly configured for inclusion in an LED lighting circuit, which LED array assembly comprises a micro-LED array mounted onto a driver integrated circuit. The driver integrated circuit comprises contact pads configured for electrical connections to a circuit board assembly. Embodiments of the method further comprise providing an essentially planar contact bridge carrier comprising a plurality of contact bridges, each contact bridge extending between a first contact pad and a second contact pad; and mounting the contact bridge carrier to the LED array assembly by forming solder bonds between the first contact pads of the contact bridge carrier and the contact pads of the LED array assembly.

In one or more embodiments, the micro-LED array comprises an array of micrometre-scale LED pixels. In embodiments, the pixel size may be less than 100 μm, and may even be in the order of 1 μm. The micro-LED array may be provided as a single die with a two-dimensional array of LEDs, or as an array of individual dies. The micro-LED array can be mounted onto the driver IC in a die-on-die assembly using soldering interconnection such as solder bumps, micro bumps, copper pillar bumps, etc. A micro-LED array of such an LED assembly may have a rated power in the order of 60 W.

The driver integrated circuit of an LED may be realised using CMOS semiconductor manufacturing processes. Such a driver integrated circuit (IC) is simply referred to as a CMOS driver IC. In one or more non-limiting embodiments, the driver integrated circuit is a CMOS driver IC.

In some embodiments, the micro-LED array has been mounted to the driver IC, for example in a reflow-solder procedure. The driver IC may be essentially square or rectangular when viewed from above, and may have an arrangement of contact pads near all four edges of its upper face, for example, 50-200 contact pads distributed along the edges of the CMOS IC to drive a micro-LED array with 1,000-20,000 LEDs. The micro-LED array is generally centered on the upper surface of the driver IC.

The expression "augmented LED array assembly" according to one or more embodiments shall be understood to mean that the LED array assembly (comprising the micro-LED array on its driver IC) is augmented by the planar contact bridge carrier, and that the completed "augmented LED array assembly" can be handled as a separate component. In some embodiments, an advantage of the augmented LED array assembly is that the "second contact pads" of the contact bridge carrier are essentially electrical connections to the driver IC contact pads. It is relatively straightforward—in a subsequent manufacturing stage—to incorporate the augmented LED array assembly in a lighting circuit, since there will not be any need to form wire bonds to the driver IC contact pads.

For a "square" or "rectangular" driver IC as described above, the contact bridge carrier can be provided as a plurality of sections, i.e. up to four sections. Each section is mounted along an edge of the driver IC, to extend outwards in the direction of the PCB to which the LED assembly will be connected. Alternatively, the contact bridge carrier can be provided in the form of a square "collar" with a square aperture for the light-emitting surface of the micro-LED array, and with first contact pads along all four inner edges and second contact pads along all four outer edges. The assembly comprising driver IC, micro-LED array and contact bridge carrier is the "augmented LED array assembly" and can be handled as a single entity.

In some embodiments, an advantage of an augmented LED array assembly is that the planar contact bridge carrier can assist in handling the assembly. For example, a tool such as a pick-and-place machine can apply suction against the upper surface of the contact bridge carrier to hold the assembly when moving it from one location to another. Such ease of handling ensures that damage to the assembly—particularly to the emission face of the LED array—can be avoided. This is in contrast to the prior art, in which an LED assembly does not include the contacts that will later be needed to connect to a PCB, and for which these contacts must later be made using wire bonds, after the LED assembly is mounted onto the heatsink. The augmented LED array assembly already includes the contacts in the form of the contact bridge carrier, so that the step of connecting the augmented LED array assembly to a PCB is greatly simplified.

According to one or more embodiments, the method of manufacturing an LED lighting circuit comprises providing an instance of an augmented LED array assembly; providing a circuit board assembly comprising a circuit board mounted onto a heat spreader, and with contact pads configured for electrical connections to the driver integrated circuit of the LED array assembly; mounting the augmented LED array assembly to the heat spreader; and bonding the second contact pads of the contact bridge carrier to the contact pads of the circuit board assembly.

In some non-limiting embodiments, the circuit board is a PCB that is formed to receive an LED assembly. Such a PCB may be formed to have a cut-out that is large enough to receive the LED assembly.

In some embodiments, an advantage of the LED lighting circuit is that it is favorably straightforward to make the electrical connections between contact pads of the PCB and the "second contact pads" of the contact bridge carrier. It is relatively easy to design the contact bridge carrier so that, when the augmented LED array assembly is put into place, the set of second contact pads of the contact bridge carrier are aligned with high precision over the PCB contact pads. A precise alignment ensures that solder connections can be easily and accurately made.

According to one or more embodiments, the augmented LED array assembly comprises an LED array assembly configured for inclusion in an LED lighting circuit, which LED array assembly comprises a micro-LED array mounted onto a driver integrated circuit, which driver integrated circuit comprises contact pads configured for electrical connections to a circuit board assembly of the LED lighting circuit; a planar contact bridge carrier comprising a plurality of contact bridges, each contact bridge extending from a first contact pad at a first edge of the contact bridge carrier to a second contact pad at a second edge of the contact bridge carrier; and wherein each contact pad of the LED array assembly is bonded to a corresponding first contact pad of the contact bridge carrier, i.e. the contact bridge carrier is mounted to the LED array assembly.

According to one or more embodiments, the LED lighting circuit comprises a circuit board assembly comprising a circuit board mounted onto a heat spreader and comprising contact pads configured for electrical connections to an LED array assembly; an instance of the augmented LED array assembly; a thermal bond between the driver IC of the augmented LED array assembly and the heat spreader of the circuit board assembly; electrical connections from the circuit board contact pads—via the contact bridge carrier—to the contact pads of the driver integrated circuit.

The dependent claims and the following description disclose particularly advantageous embodiments and features of one or more embodiments. Features of the embodiments may be combined as appropriate. Features described in the context of one claim category can apply equally to another claim category.

The description uses a convention in which the light-emitting face of the micro-LED array is regarded as an "upper" face, and this convention shall be understood to apply to all other elements of embodiments of the assemblies so that all faces with the same orientation are regarded as "upper" faces. The contact bridge carrier therefore also has an "upper" face and an opposite "lower" face. In a specific embodiment, the first and second contact pads of the contact bridge carrier are formed on its lower face; the contact pads of the driver IC are formed on the upper face of the driver IC; and the contact pads of the circuit board assembly are formed on the upper surface of the PCB.

In a specific embodiment, the circuit board comprises an aperture exposing a region of the heat spreader, and the aperture is shaped to accommodate the LED array assembly. The clearance can serve to improve heat dissipation during operation. Preferably, the heat spreader comprises a raised seat or "pedestal" extending upward into the aperture configured to receive the LED array assembly.

The contact bridge carrier can be realised as a single-layer carrier, i.e. the contact bridges are printed or deposited as conductive tracks on one face of the carrier, preferably on its lower face. In a specific embodiment, the contact bridge carrier can comprise a multi-layer substrate, with the contact bridges formed in an interior layer of the carrier. In a highly specific embodiment, the contact bridge carrier is flexible, i.e. it is realised as a flexible substrate or "flex carrier", with thin conductive tracks enclosed in layers of polyimide, for example.

The upper face of the contact bridge carrier is of some embodiments not higher than the emission face of the micro-LED array. As mentioned above, the contact bridge carrier can be formed in the shape of a single square or rectangular "collar". Alternatively, an augmented LED array assembly can comprise several rectangular contact bridge carriers, for example one along each of four sides, or two L-shaped contact bridge carrier, etc.

The solder bonds between the first contact pads of the contact bridge carrier and the contact pads of the LED array assembly can be formed using any suitable technique.

The planar carrier may be very thin, and preferably has an inherent degree of flexibility. Therefore, it may be advantageous to take appropriate measures to avoid damage to the solder bonds at the first contact pads of the contact bridge carrier. In a specific embodiment, the method of manufacturing the augmented LED array assembly comprises applying underfill about the soldered bonds. The underfill can completely surround a solder bond, or it may be sufficient to apply the underfill along one or more sides of a solder bond.

Embodiments of a method of manufacturing an LED lighting circuit can commence with mounting an augmented LED array assembly onto the heat spreader of the circuit assembly. In a specific embodiment, this is done by first applying a thermally-conductive adhesive layer to a dedicated mounting surface of the heat spreader. This mounting surface can be a region of the heat spreader exposed by an aperture in the PCB. The thermally-conductive adhesive layer may be any of a layer of thermally conductive glue, a thermal paste, a silver thermal compound, a double-sided adhesive tape, etc. Preferably, a heat-curable thermal adhesive is used. In this case, the step of mounting the augmented LED array assembly to the heat spreader is followed by a step of oven-curing the thermally-conductive adhesive layer.

After thermally bonding the augmented LED array assembly to the heatsink, all that remains is to form the electrical connections between the PCB contact pads and the second contact pads of the contact bridge carrier(s). In a particularly specific embodiment, this is done in a hot bar soldering step. To this end, one or both sets of contact pads is coated with a solder filler metal. Assuming the contact pads of each pair are in alignment, they can be permanently bonded together by simply applying pressure and heat. This can be done by pressing the heated tip of a tool (the "hot bar") onto the upper face of the contact bridge carrier.

In a specific embodiment, a flexible contact bridge carrier is realised to accommodate a height difference of several millimetres between its outer perimeter and the upper face of the PCB. With a sufficiently flexible contact bridge carrier, the outer perimeter can be deflected downwards during a bonding step as described above.

In a further specific embodiment, the augmented LED array assembly comprises a number of passive circuit components mounted onto the contact bridge carrier, for example capacitors, resistors, etc.

The primary purpose of the contact bridge carrier is to provide an improvement over the conventional approach, which is to use wire bonds to connect an LED assembly to a PCB. However, the contact bridge carrier is not restricted to simply providing "bridges" between PCB contacts and driver IC contacts. Therefore, in a specific embodiment, the contact bridge carrier also comprises conductive tracks for additional switching circuitry. Such tracks can be embedded in the body of the carrier, with contact pads at the upper or lower surface of the carrier, as appropriate. One or more embodiments of augmented LED assembly can also comprise a number of switching circuit components mounted onto the contact bridge carrier. In this way, part of the control circuitry which would otherwise be provided on the PCB can instead be provided on the contact bridge carrier. With such an embodiment of the augmented LED assembly, the PCB of the lighting circuit can be smaller than the PCB of a comparable prior art lighting circuit. Furthermore, because the switching circuit components can be closer to the CMOS IC, this can reduce signal noise.

Other features of disclosure will become apparent from the following detailed descriptions considered in conjunction with the accompanying drawings. It is to be understood, however, that the drawings are designed solely for the purposes of illustration and not as a definition of the limits of the claims.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
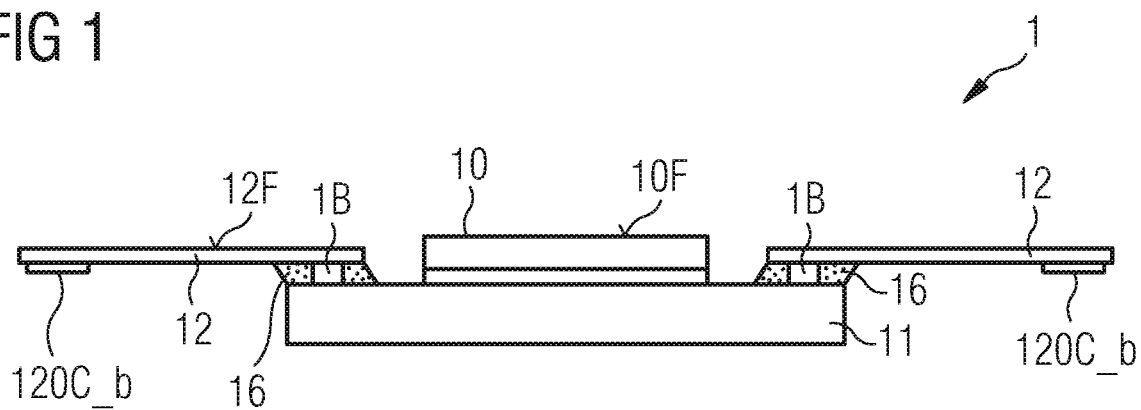
FIG. 1 shows a cross-section through an embodiment of an augmented LED array assembly.
Figure 2:
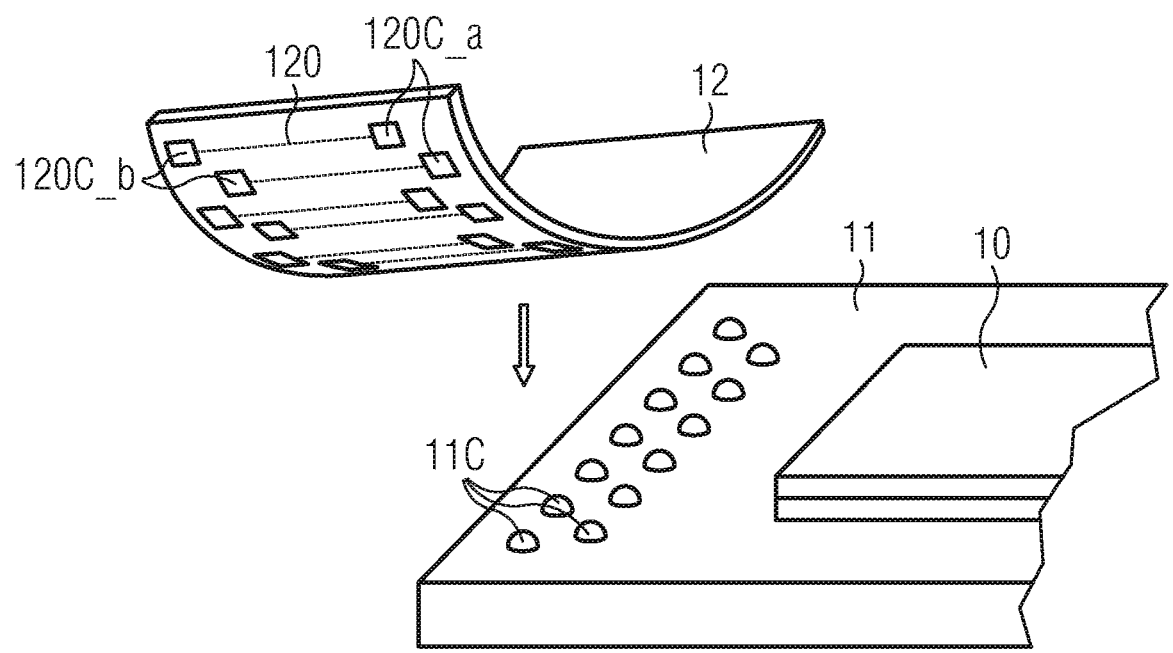
FIG. 2 shows a cross-section through a contact bridge carrier of an augmented LED array assembly.

FIG. 1 shows an embodiment of an augmented LED array assembly 1, and shows an LED array assembly 10, 11 configured for inclusion in an LED lighting circuit. The LED array assembly 10, 11 comprises a micro-LED array 10 mounted onto a driver integrated circuit 11. FIG. 2 illustrates a manufacturing stage of the augmented LED array assembly 1, and shows a flexible contact bridge carrier 12 relative to one side of the driver IC 11. The driver integrated circuit 11 has contact pads 11C (some of these can be seen in FIG. 2) such as gold bumps of a ball grid array (BGA) which serve to electrically connect the driver IC 11 to external circuitry.

The diagrams show an essentially planar flexible carrier 12 with a plurality of contact bridges 120 realised as a thin flexible PCB 12 with contact bridges 120 in its interior. A contact bridge 120 extends between a first "inner" contact pad 120C_a and a second "outer" contact pad 120C_b. The outer layers of the flex PCB 12 can be a suitable material such as polyimide, for example. The contact pads 120C_a, 120C_b can be made by depositing or printing copper or any other suitable metal.

Each contact pad 11C of the driver integrated circuit 11 is soldered or bonded to an inner contact pad 120C_a of the planar carrier 12 to achieve a permanent bond 1B as shown in FIG. 1, which also indicates underfill 16 applied to the solder bond 1B in order to prevent damage to the electrical connection 1B during handling of the assembly 1. The diagram also shows that the upper face 12F of the contact bridge carrier (12 is no higher than the emission face 10F of the micro-LED array 10.

Figure 3:
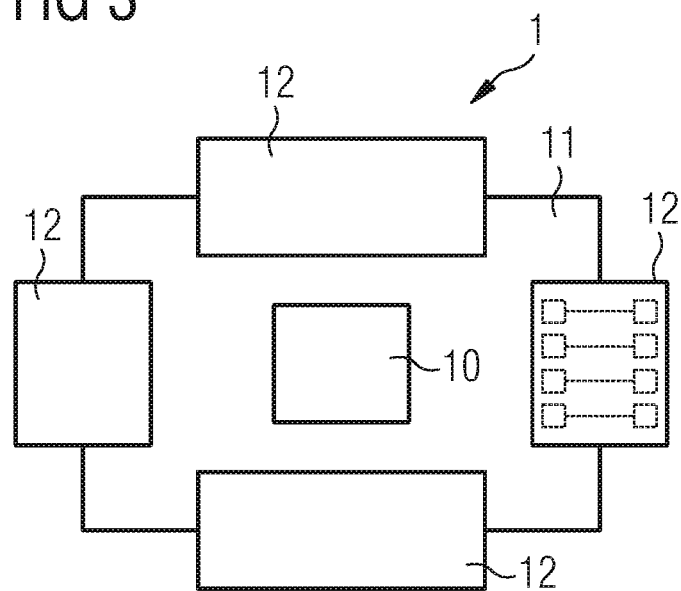
FIG. 3 shows a plan view of an embodiment of an augmented LED array assembly.

FIG. 3 shows a plan view of an embodiment of an augmented LED array assembly 1. In this very simplified exemplary embodiment, the planar carrier comprises four sections arranged along the four sides of the LED array assembly, and each carrier section 12 can connect one quarter of the driver contacts to a circuit board assembly. A number of contact pads 120C_a, 120C_b and contact bridges 120 are indicated by the broken lines on the right-hand carrier section 12.

Figure 4:
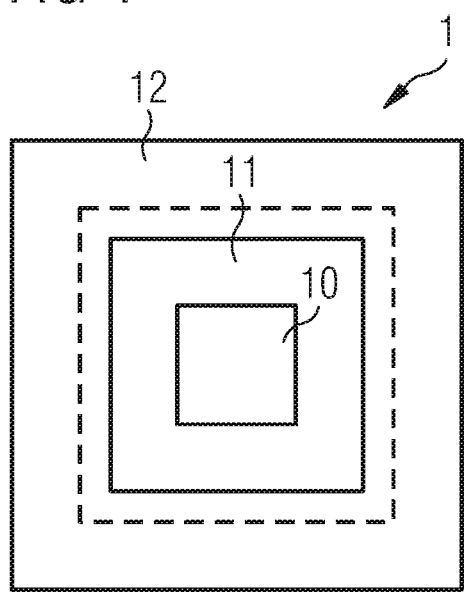
FIG. 4 shows a plan view of a further embodiment of an augmented LED array assembly.

FIG. 4 shows a plan view of a further embodiment of an augmented LED array assembly 1. In this very simplified exemplary embodiment, the planar carrier has the form of a square "collar" and extends about the four sides of the LED array assembly. The outer perimeter of the driver IC 11 is indicated by the dotted line.

Figure 5:
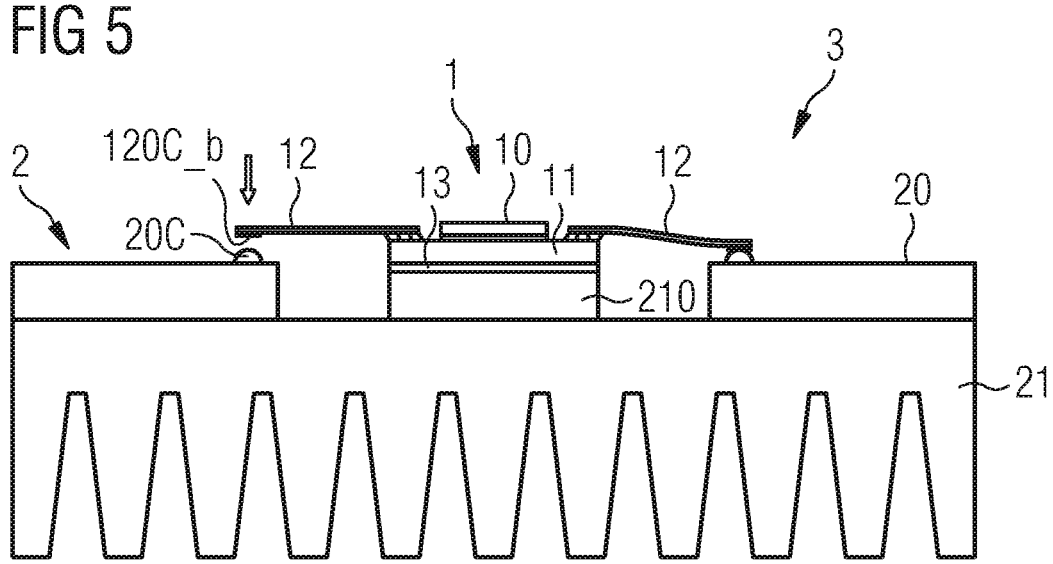
FIG. 5 shows a cross-section through an embodiment of an LED lighting circuit.

FIG. 5 shows an embodiment of a LED lighting circuit 3 at a manufacturing stage, and shows a circuit board assembly 2 with a circuit board 20 mounted onto a heat spreader 21. The circuit board 20 has contact pads 20C configured for electrical connections to the driver IC 11 of the LED array assembly. The diagram shows an embodiment of an augmented LED array assembly 1, after forming a thermal bond 13 between the driver integrated circuit 11 and the heat spreader 21 of the circuit board assembly 2. In this embodiment, the heat spreader 21 is shaped to have a raised seat 210 configured to receive the driver IC 11. On the left-hand side of the diagram, the outer or second contact pad 120C_b of the flexible carrier 12 is about to be soldered to a corresponding contact pad 20C of the PCB 20. To this end, a hot bar soldering tool will press the flexible carrier 12 towards the PCB 20, while applying heat. The combination of heat and pressure will bond the second contact pad 120C_b to the PBC contact pad 20C. On the right-hand side of the diagram, the outer or second contact pad 120C_b of the flexible carrier 12 has already been soldered to a corresponding contact pad 20C of the PCB 20. The flexibility of the carrier 12 makes it easy to form the bonds, and also allows a considerable difference in height to be overcome.

Figure 6:
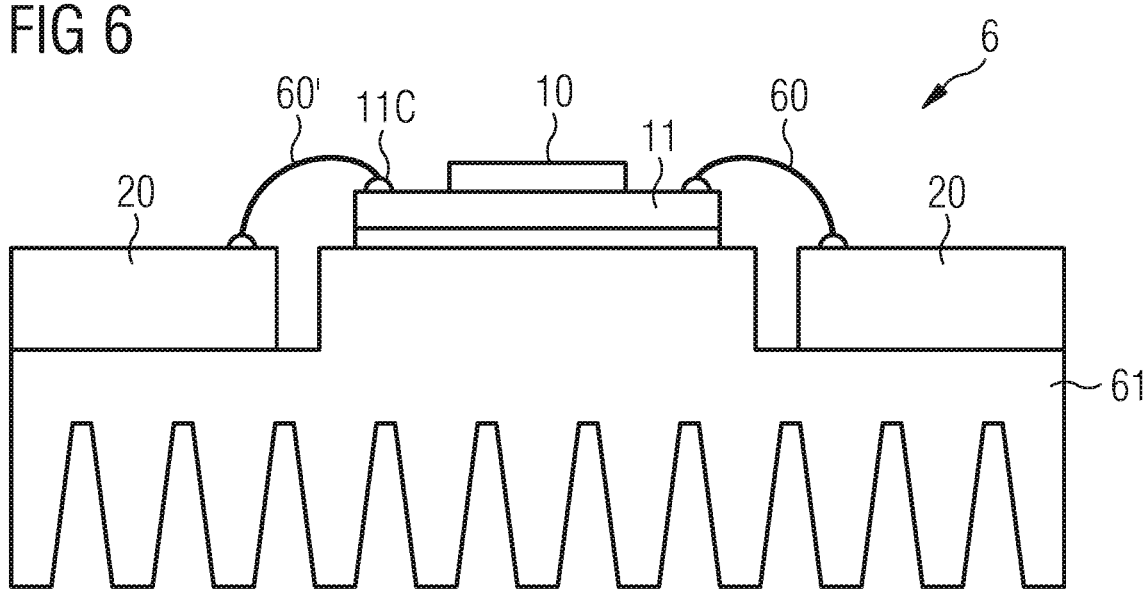
FIG. 6 shows a prior art LED lighting circuit.

FIG. 6 shows a prior art LED lighting circuit 6, with a driver IC 11 mounted on a heat sink 61 arranged in an aperture of a circuit board 20. Here, wire bonds 60 are used to connect the contact pads 20C of the circuit board 20 to contact pads 11C of the driver IC 11. This type of assembly can be expensive when the driver IC 11 has a many contact pads 11C, for example 200 contact pads 11C requiring 200 wire bonds 60.

Although the disclosure describes embodiments and variations thereon, it will be understood that numerous additional modifications and variations could be made thereto without departing from the scope of the claims.

For the sake of clarity, it is to be understood that the use of "a" or "an" throughout this application does not exclude a plurality, and "comprising" does not exclude other steps or elements.

What is claimed is:

1. A method of manufacturing an augmented LED array assembly comprising:
providing an LED array assembly, the LED array assembly comprising a micro-LED array mounted onto a driver integrated circuit, the driver integrated circuit comprising a plurality of driver integrated circuit contact pads on a top surface of the driver integrated circuit;
providing a flexible printed circuit board (PCB) comprising a bottom surface, a plurality of first contact pads on the bottom surface, a plurality of second contact pads on the bottom surface, and a plurality of contact bridges, each of the plurality of contact bridges extending between one of the plurality of first contact pads and one of the plurality of second contact pads; and
mounting the flexible PCB to the LED array assembly by forming solder bonds between the plurality of first contact pads of the flexible PCB and the driver integrated circuit contact pads.

2. The method according to claim 1, wherein the solder bonds are formed in a reflow soldering process.

3. The method according to claim 1, further comprising applying underfill about the solder bonds at the driver integrated circuit contact pads.

4. The method according to claim 1, wherein the solder bonds are formed in a diffusion soldering process.

5. A method of manufacturing an LED lighting circuit comprising:
providing an augmented LED array assembly that comprises:
an LED array assembly comprising a micro-LED array mounted on a driver integrated circuit (IC), the driver IC comprising driver IC contact pads on a top surface of the driver IC, and
a flexible printed circuit board (PCB) comprising a bottom surface, a plurality of first contact pads on the bottom surface, a plurality of second contact pads on the bottom surface, and a plurality of contact bridges, each of the plurality of contact bridges extending from one of the plurality of first contact pads to one of the plurality of second contact pads,
each of the plurality of driver IC contact pads being bonded to a corresponding one of the plurality of first contact pads of the flexible PCB;
providing a circuit board assembly comprising a circuit board mounted onto a heat spreader and comprising circuit board assembly contact pads;
mounting the augmented LED array assembly to the heat spreader; and
bonding the plurality of second contact pads of the flexible PCB to the circuit board assembly contact pads.

6. The method according to claim 5, wherein mounting the augmented LED array assembly to the heat spreader is preceded by applying a thermally-conductive adhesive layer to a mounting surface of the heat spreader.

7. The method according to claim 6, wherein mounting the augmented LED array assembly to the heat spreader is followed by curing the thermally-conductive adhesive layer.

8. The method according to claim 5, wherein bonding the second contact pads of the contact bridge carrier to the contact pads of the circuit board assembly is performed by hot bar soldering.

9. An augmented LED array assembly comprising:
an LED array assembly comprising a micro-LED array mounted on a driver integrated circuit (IC), the driver integrated circuit comprising driver IC contact pads on a top surface of the driver IC; and
a flexible printed circuit board (PCB) comprising a bottom surface, a plurality of first contact pads on the bottom surface, a plurality of second contact pads on the bottom surface, and a plurality of contact bridges, each of the plurality of contact bridges extending from one of the plurality of first contact pads to one of the plurality of second contact pads; and
each of the plurality of driver IC contact pads being bonded to a corresponding one of the plurality of first contact pads of the flexible PCB.

10. The augmented LED array assembly according to claim 9, wherein the flexible PCB comprises a multi-layer flexible substrate.

11. The augmented LED array assembly according to claim 9, wherein:
the micro-LED array has an emission face, and
an upper face of the flexible PCB is not higher than the emission face of the micro-LED array.

12. The augmented LED array assembly according to claim 9, further comprising a plurality of passive circuit components on the flexible PCB.

13. The augmented LED array assembly according to claim 9, wherein the flexible PCB further comprises conductive tracks for additional switching circuitry.

14. The augmented LED array assembly according to claim 13, further comprising a plurality of switching circuit components the flexible PCB.

15. An LED lighting circuit comprising:
a circuit board assembly comprising a circuit board on a heat spreader and circuit board assembly contact pads;
an augmented LED array assembly that comprises:
an LED array assembly comprising a micro-LED array mounted on a driver integrated circuit (IC), the driver integrated circuit comprising driver IC contact pads on a top surface of the driver IC, and
a flexible printed circuit board (PCB) comprising a bottom surface, a plurality of first contact pads on the bottom surface, a plurality of second contact pads on the bottom surface, and a plurality of contact bridges, each of the plurality of contact bridges extending from one of the plurality of first contact pads to one of the plurality of second contact pads,
each of the plurality of driver IC contact pads being bonded to a corresponding one of the plurality of first contact pads of the flexible PCB and each of the circuit board assembly contact pads being bonded to a corresponding one of the plurality of second contact pads of the flexible PCB; and
a thermal bond between the driver integrated circuit of the augmented LED array assembly and the heat spreader of the circuit board assembly.

16. The LED lighting circuit according to claim 15, wherein:
the circuit board includes an aperture, and
the heat spreader comprises a raised seat extending upward into the aperture and configured to receive the LED array assembly.

* * * * *